US010715147B1

(12) United States Patent
Tejada et al.

(10) Patent No.: US 10,715,147 B1
(45) Date of Patent: Jul. 14, 2020

(54) HIGH SPURIOUS-FREE DYNAMIC-RANGE LINE DRIVER

(71) Applicant: Analog Devices International Unlimited Company, Limerick (IE)

(72) Inventors: Jose Tejada, Valencia (ES); Santiago Iriarte, Puzol (ES); Miguel A. Ruiz, Riba-Roja de Turia (ES)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/564,983

(22) Filed: Sep. 9, 2019

(51) Int. Cl.
| | | |
|---|---|---|
| *H03K 19/09* | (2006.01) | |
| *H03K 19/00* | (2006.01) | |
| *H03K 19/096* | (2006.01) | |
| *G06F 7/506* | (2006.01) | |
| *G05F 1/569* | (2006.01) | |

(52) U.S. Cl.
CPC ......... *H03K 19/0963* (2013.01); *G05F 1/569* (2013.01); *G06F 7/506* (2013.01); *H03K 19/0016* (2013.01)

(58) Field of Classification Search
CPC ........... H03K 19/0963; H03K 19/0016; G06F 7/506; G05F 1/569
See application file for complete search history.

(56) References Cited

U.S. PATENT DOCUMENTS

| | | | | |
|---|---|---|---|---|
| 5,949,259 | A * | 9/1999 | Garcia | H03F 3/3001 327/111 |
| 6,255,909 | B1 | 7/2001 | Muza | |
| 7,420,395 | B2 * | 9/2008 | Kuramasu | H03K 19/018528 326/68 |
| 7,876,129 | B2 * | 1/2011 | Lu | H03K 19/00361 326/68 |
| 8,476,940 | B2 | 7/2013 | Kumar | |
| 9,143,133 | B2 | 9/2015 | Liu et al. | |

* cited by examiner

*Primary Examiner* — Daniel D Chang
(74) *Attorney, Agent, or Firm* — Schwegman Lundberg & Woessner, P.A.

(57) ABSTRACT

A line driver circuit is configured to provide a high spurious free dynamic range output and includes first and second output transistors and a control circuit. The first output transistor is controllable to pull an output node to a logic high state, and the second output transistor is controllable to pull the output node to a logic low state. The first control circuit is connected to a control input of the first output transistor and configured to establish a control signal at the control input of the first output transistor while the second output transistor is in a low impedance operating state to reduce an imbalance in turn-on delay between the first output transistor and the second output transistor.

20 Claims, 7 Drawing Sheets

HIGH SPURIOUS-FREE DYNAMIC-RANGE LINE DRIVER

TECHNICAL FIELD

This document pertains generally, but not by way of limitation, to line drivers and particularly but not by way of limitation to line drivers configured to generate high spurious-free dynamic-range outputs.

BACKGROUND

Line drivers may be configured to generate square output signals, for example, using one or more input stimuli. In an example, a line driver may be configured to generate a 10V square signal at an output for a load. The spurious-free dynamic range (SFDR) of the line driver is a measure of the ratio of the primary output signal to the largest spurious signal on the output.

SUMMARY

It is desirable to have a high SFDR for a line driver. SFDR can be affected by many properties of the line driver, some of which include duty cycle deviation from exactly 50%, a difference in rise and fall times for the ramps of the output signal, and artifacts in the waveform that are not symmetrical. Line drivers often include two output transistors, one to pull the output signal high, and the other to pull the output signal low. The present inventors have realized, among other things, that pre-charging an output transistor that is currently off prior to turning off the other respective output transistor, can help equalize delay for rise and fall times of the output signal, keeping the duty cycle as close to 50% as possible.

In one example, a line driver circuit is configured to provide a high spurious free dynamic range output and includes first and second output transistors and a control circuit. The first output transistor is controllable to pull an output node to a logic high state, and the second output transistor is controllable to pull the output node to a logic low state. The first control the first control circuit includes an amplifier circuit, a feedback capacitor connected between the output node and the amplifier circuit, and a current source connectable to the feedback capacitor and the amplifier circuit. The first control circuit is controllable to establish a control signal at an output of the amplifier circuit and the control input of the first output transistor while the second output transistor is in a low impedance operating state to reduce an imbalance in turn-on delay between the first output transistor and the second output transistor.

In another example, a method of generating a high spurious free dynamic range output for a line driver includes controlling first and second output transistors to pull an output node to a logic high state; generating, by a first control circuit, a control input for the first output transistor to establish a control signal at the control input while the second output transistor is on and operating in a low impedance state to reduce an imbalance in turn-on delay between the first output transistor and the second output transistor; and controlling the first and the second output transistor to pull the output node to a logic low state.

In another example, a line driver includes first output means controllable to pull an output node to a logic high state, second output means controllable to pull the output node to a logic low state, and control means connected to a control input of the first output means and configured to establish a control signal at the control input of the first output means while the second output means is in a low impedance operating state to reduce an imbalance in turn-on delay between the first output means and the second output means.

Each of these non-limiting examples or aspects can stand on its own, or can be combined in various permutations or combinations with one or more other examples or aspects. This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A high spurious-free dynamic-range (SFDR) line driver is disclosed herein that equalizes the rise and fall delay times of the output signal to increase the SFDR of the line driver. In an example, the line driver may be configured as a combination metal-oxide-semiconductor field-effect transistor (CMOS) circuit that includes p-type (PMOS) and n-type (NMOS) devices. The line driver utilizes a pre-charge scheme that takes each side (NMOS and PMOS) to a controlled state in the saturation region of the respective NMOS or PMOS device(s) before allowing the output of the line driver to change. This way, the signal delay depends on the small-signal linear parameters of the CMOS devices. The line driver may be further configured to ensure equal rise and fall times of the output signal and ensure low noise in the output signal.

Figure 1:
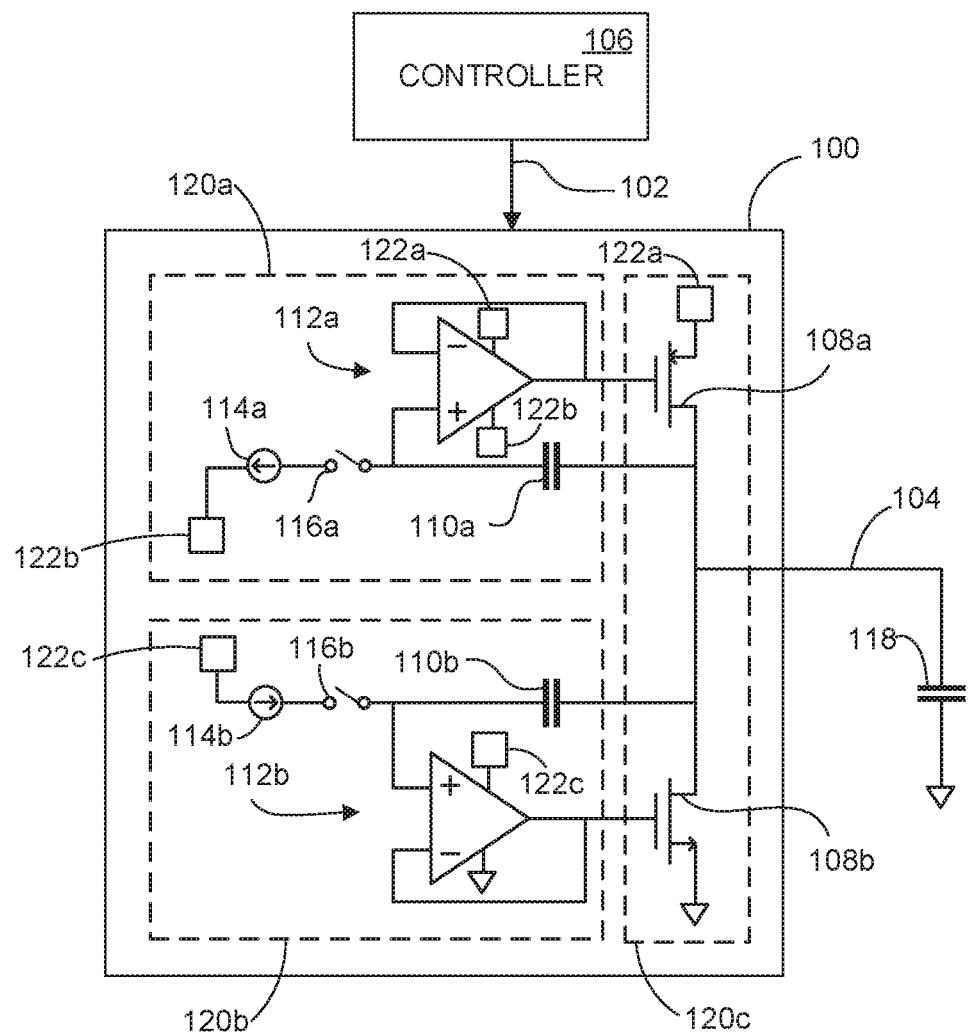
FIG. 1 is a block diagram illustrating an example line driver that generates a high SFDR output.

FIG. 1 is a block diagram illustrating an example line driver 100 configured to generate a high SFDR output. The line driver 100 receives input 102 and generates the output 104. A controller 106 may be used to provide control for components of the line driver 100 through the input 102, which may include stimulus signals used by the line driver 100 to generate the output 104. In other examples, the stimulus signals may be provided separately from the controller 106. The controller 106 may be configured using digital circuitry, analog circuitry, or a combination thereof.

The line driver 100 includes high voltage output devices 108a and 108b. The high voltage output device 108a may be a p-type metal-oxide-semiconductor field-effect transistor (p-type MOSFET) device and the high voltage output device 108b may be an n-type MOSFET device. The line driver 100 also includes feedback capacitors 110a and 110b, voltage buffers 112a and 112b, current sources 114a and 114b, and switches 116a and 116b. The output line 104 may be connected to provide the output to a load represented by a capacitor 118, for example. The output may be a high SFDR square wave. The output device 108a may be controlled to pull the output line high and the output device 108b may be controlled to pull the output line low to generate the square wave output.

To limit noise in the output signal, the line driver 100 may be sourced by linear regulators, for example. The line driver 100 may include three separate voltage domains 120a-120c. The p-side voltage domain 120a may be connected between a first linear dropout (LDO) regulator 122a and a second LDO 122b that is a specified voltage less than the first LDO 122a. For example, the first LDO 122a may be approximately 10V and the second LDO 122b may be approximately 7.4V. The n-side voltage domain 120b may be connected between a third LDO 122c and ground. The third LDO 122c may supply 2.6V, for example. The high voltage output devices 108a and 108b may be part of the third voltage domain 120c, which may be connected between the first LDO and ground. This way, the p-side voltage domain 120a and the n-side voltage domain 120b can use 2.5V devices, limiting the total number of high-voltage devices that may be needed for the line driver 100.

The feedback capacitors 110a and 110b may be used to control the ramp times of the output signal 104. To maximize the SFDR, the output ramp times should be as close to equal as possible. Using the feedback capacitors 110a and 110b and the current sources 114a and 114b, the ramp times can be controlled regardless of the capacitance of the capacitor 118. The voltage buffers 112a and 112b may be used to decouple the parasitic gate-to-drain capacitances of the output devices 108a and 108b. Thus, the current from current sources 114a and 114b and the capacitance of the feedback capacitors 110a and 110b may be controlled to equalize the ramp times of the output signal.

Equalizing the ramp times and reducing the noise through the use of the LDO 122a helps to increase the SFDR of the output signal. However, differences in the delay times of the rise and fall ramps may cause a departure from a 50% duty cycle for the output, resulting in a reduced SFDR. One of the main causes of differences in these delay times can be differences in turn-on times of the output devices 108a and 108b. A pre-charge scheme for the output devices 108a and 108b can be used to limit or eliminate the differences in turn-on delay between the output devices 108a and 108b. The pre-charge scheme may include bringing a gate-to-source voltage ($V_{GS}$) of a respective output device 108a and 108b to a value just above the turn-on threshold voltage ($V_{TH}$) of the respective output device 108a and 108b while the other output device 108a and 108b turned on and acting as a low impedance device. Once the gate of the respective output device 108a and 108b is at the pre-charge voltage, the other output device 108a and 108b can be turned off and the respective output device can be brought to a $V_{GS}$ such that it is acting as a an amplifier device.

Figure 2:
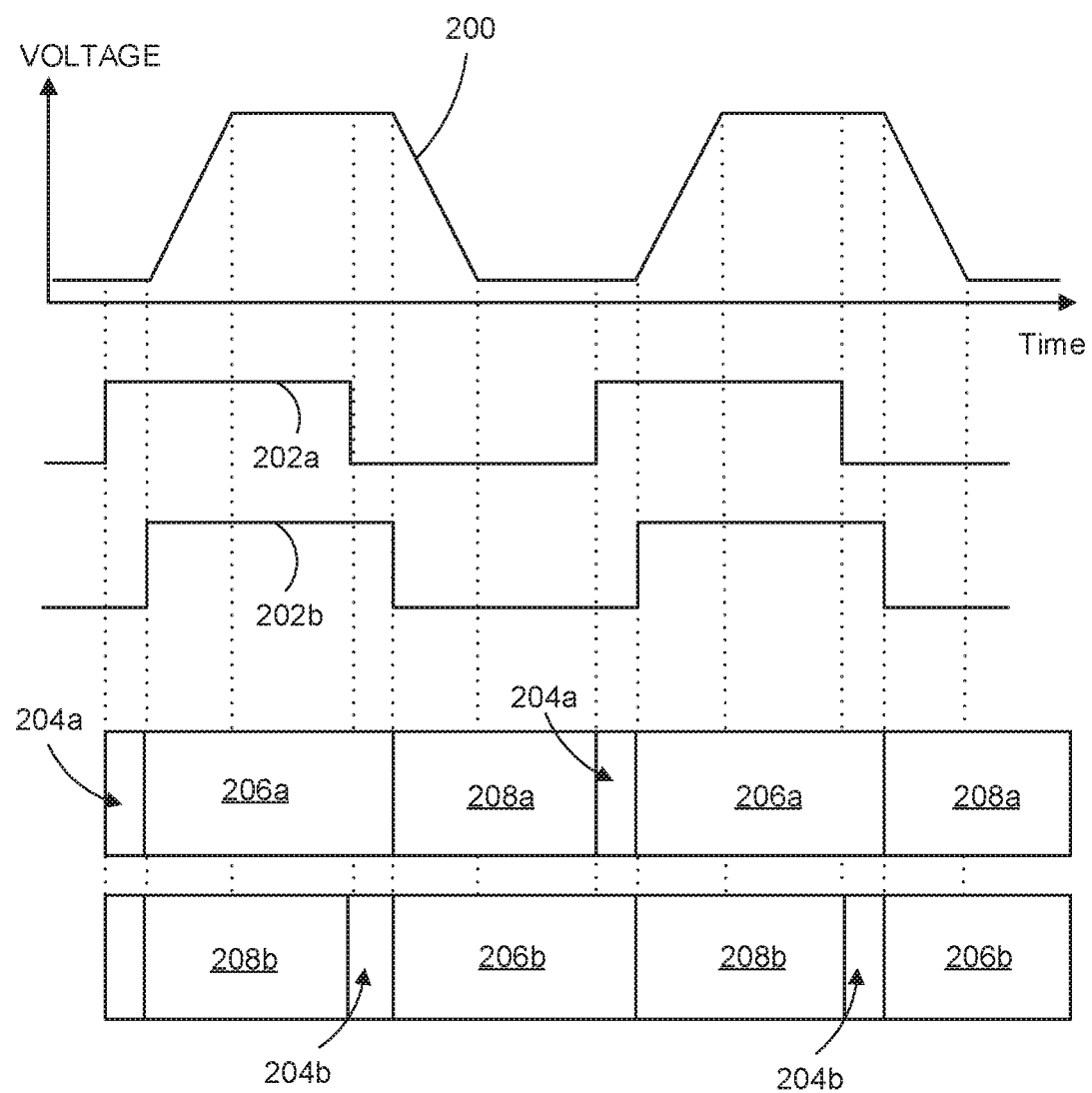
FIG. 2 is a chart illustrating example input stimuli, an output, and operating regions for the line driver.

FIG. 2 is a chart illustrating example output signal 200, input stimuli signals 202a and 202b, and operating modes for respective control circuits of the p-side and the n-side of the line driver 100. The output signal 200 may be a square wave having a maximum output voltage of approximately 10V, for example. When the output signal 200 transitions from low to high or high to low, the signal 200 can have rise and fall times between 400 ns and 3.2 μs, for example. The period of the output signal may be between 5 μs and 501 μs, for example. In other examples, the output signal 200 can include any other desirable attributes.

To maximize the SFDR, the rise and fall times of the square wave output signal 200 should be equal, the duty cycle of the square wave output signal 200 should be as close to 50% as possible, and any artifacts in the output signal 200 should be symmetrical. This ensures that the SFDR can be improved to a desirable value, such as better than −60 dB, for example. To ensure that the duty cycle remains as close to 50% as possible, a respective line driver may be controlled using a pre-charge scheme to equalize the on-delay and the off-delay between the input stimuli 202a and 202b and the output signal 200.

To facilitate the pre-charge scheme, the two input stimuli 202a and 202b may be used. The input stimuli 202a and 202b may be digital clock signals, for example, and the stimulus 202b may be a delayed version of the input stimulus 202a that is delayed by an amount of time sufficient to charge a gate of a respective output device to a desired pre-charge $V_{GS}$ just above the turn-on $V_{TH}$ of the output device. While one output device is in pre-charge, the other output device is on and acting as a low impedance device. Then, once the other output device is turned off, the $V_{GS}$ of the output device is increased such that the output device acts initially as an amplifier device during the ramp of the output signal, and then transitions to the triode region and acts as a low impedance device. While acting as the amplifier device, the respective amplifier 112a or 112b and respective feedback capacitor 110a or 110b act as a current source to charge/discharge the output with a fixed current.

In the example illustrated in FIG. 2, time regions 204a are for p-side pre-charge, 204b are for n-side pre-charge, 206a are for the p-side device being on and acting initially as an amplifier device, and then as a low impedance device, 206b are for the n-side device being on and acting initially as an amplifier device, and then as a low impedance device, 208a are for the p-side device being off, and 208b are for the n-side device being off. When the input stimulus 202a transitions high, pre-charge begins for the p-side output device and when the input stimulus 202a transitions low, pre-charge begins for the n-side output device. When the input stimulus 202b transitions high, the p-side device is brought to a state in which it acts as a low impedance device and the n-side device is turned off, and when the input stimulus 202b transitions low, the p-side device is turned off and the n-side device is brought to a state in which it acts as a low impedance device.

Figure 3:
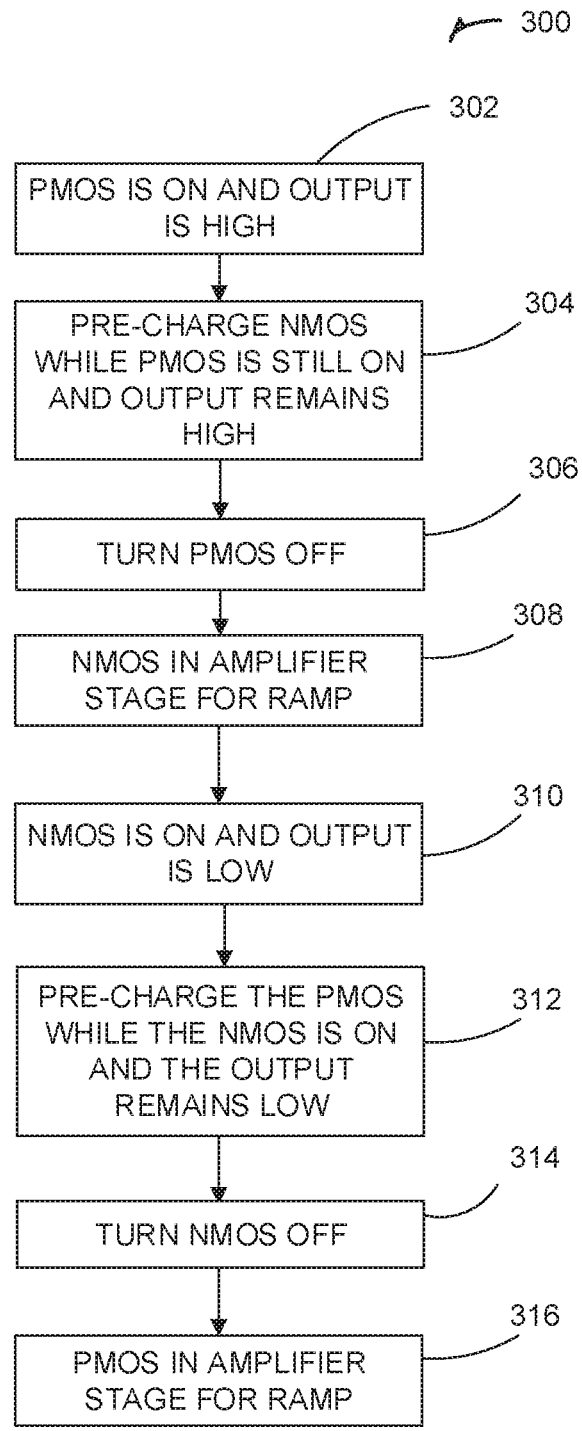
FIG. 3 is a flowchart illustrating a method of pre-charging output devices of a line driver to equalize turn-on delay of the output devices.

FIG. 3 is a flowchart illustrating a method 300 of pre-charging output devices of a line driver to equalize turn-on delay of the output devices. The method 300 may illustrate one period of the output signal, which may be a square wave, for example, similar to the output signal 200 of FIG. 2. The output devices of the line driver may be p-type and n-type MOSFETs. At step 302, the p-type MOSFET is conducting and acting as a low impedance device and thus, the output of the line driver is high, such as 10V. At step 304, pre-charge of the n-type MOSFET begins. During pre-charge of the n-type MOSFET, the p-type MOSFET remains on and acting as a low impedance device. During pre-charge of the n-type MOSFET, the gate-to-source voltage ($V_{GS}$) of the n-type MOSFET is increased to a controlled value in the saturation region of the n-type MOSFET, and may be just above the turn-on threshold ($V_{TH}$) of the n-type MOSFET and slightly below the $V_{GS}$ achieved during transition of the output signal in conventional line driver circuits, for example. The p-type MOSFET is still on and acting as a low impedance device and thus, the output voltage is not affected by the n-type MOSFET during pre-charge. At step 306, following pre-charge of the n-type MOSFET, the p-type MOSFET is turned off and the n-type MOSFET is brought to an amplifier state at step 308, which begins the ramp of the output signal. At step 310, following the ramp of the output signal, the n-type MOSFET is controlled to a low-impedance state, keeping the output signal low, such as at 0V, for example. This step may include circuitry specifically to saturate the n-type MOSFET to transition from the amplifier state to the low impedance state, such as in examples with a single voltage domain, or the driver circuit may be configured such that the device naturally transitions to the low impedance state, such as in examples with multiple voltage domains.

Pre-charge for the p-type MOSFET is similar to that of the n-type MOSFET. At step 310, the n-type MOSFET is conducting and acting as a low impedance device and thus, the output signal is low. At step 312, pre-charge of the p-type MOSFET begins. During pre-charge of the p-type MOSFET, the n-type MOSFET remains on and acting as a low impedance device. During pre-charge of the p-type MOSFET, the gate-to-source voltage ($V_{GS}$) of the p-type MOSFET is brought to a controlled value in the saturation region of the p-type MOSFET, which may be just above the turn-on threshold ($V_{TH}$) of the p-type MOSFET. At step 314, following pre-charge of the p-type MOSFET, the n-type MOSFET is turned off and the p-type MOSFET is brought to an amplifier state to begin the ramp of the output signal. At step 316, following the ramp of the output signal, the p-type MOSFET is brought to a low impedance state, keeping the output signal high, such as 10V, for example. This step may include circuitry specifically to saturate the p-type MOSFET to transition from the amplifier state to the low impedance state, such as in examples with a single voltage domain, or the driver circuit may be configured such that the device naturally transitions to the low impedance state, such as in examples with multiple voltage domains. The method 300 can be repeated for the duration of operation of the line driver.

Figure 4:
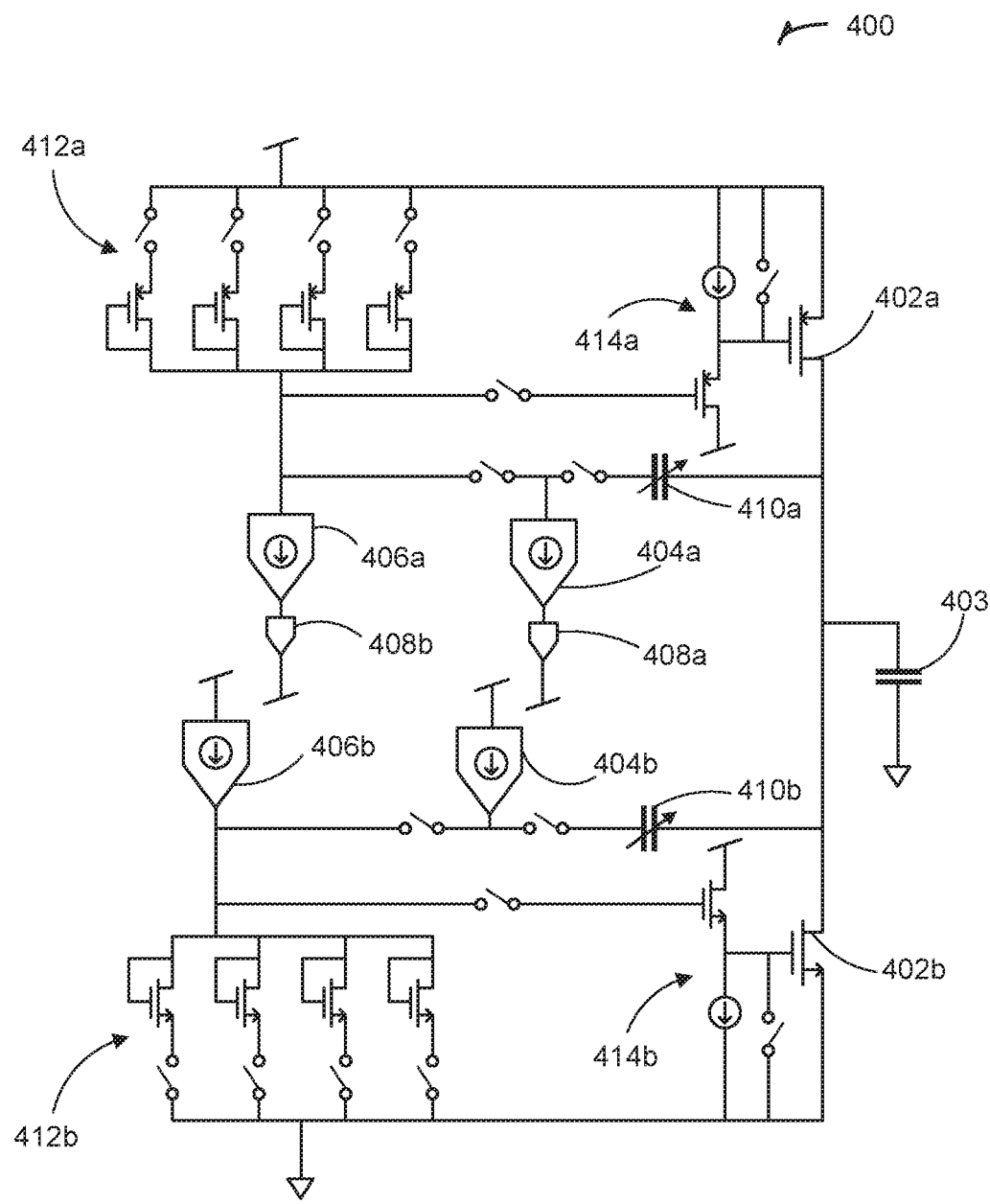
FIG. 4 is a circuit diagram illustrating an example line driver that includes configurable devices to control delay times and slope times of the output of the line driver.

FIG. 4 is a circuit diagram illustrating an example line driver 400 that includes configurable devices to control delay times and slope times of the ramps of the output signal of the line driver 400. The line driver 400 includes output devices 402a and 402b controlled to generate an output for a load capacitor 403, ramp current digital-to-analog converters (DACs) 404a and 404b, pre-charge current DACs 406a and 406b, mismatch DACs 408a and 408b, variable feedback capacitors 410a and 410b, diode connected device circuits 412a and 412b, and source follower circuits 414a and 414b. The ramp current DAC 404a, the pre-charge current DAC 406a, the mismatch DACs 408a and 404b, the variable feedback capacitor 410a, the diode-connected device circuit 412a, and the source follower circuit 414a form a control circuit connected to generate a signal for a control input (e.g., the gate) of the output device 402a. The ramp current DAC 404b, the pre-charge current DAC 406b, the variable feedback capacitor 410b, the diode-connected device circuit 412b, and the source follower circuit 414b (which may act as the voltage buffer 112b, for example) form a control circuit connected to generate a signal for a control input (e.g., the gate) of the output device 402b.

As discussed above, to ensure a high SFDR, the ramp time of the output signal may be controlled to be equal for the rising and falling ramps. This can be accomplished using the feedback capacitors 410a and 410b, and the ramp current DACs 404a and 404b. To control the slopes, the feedback capacitors 410a and 410b are used to create a feedback loop that creates an integrator. When current is pulled into the input side of the capacitors 410a and 410b by the ramp current DACs 404a and 404b, the current will get multiplied and transferred to the output due to the feedback loop. Since the output load is capacitive (indicated by the capacitor 403), this creates a controlled output ramp for both the rising and the falling edges of the signal. The slope of the ramps can be set by adjusting the current from the respective ramp current DACs 404a and 404b and/or the capacitance of the respective feedback capacitors 410a and 410b. In an example, the ramp current DACs 404a and 404b and the feedback capacitors 410a and 410b may be configured to generate slope times between 400 ns and 3.2 µs. The capacitors 410a and 410b are illustrated as variable capacitors, but could be implemented as an array of capacitors with associated switches to control a capacitance value, or as any other circuit controllable to vary a feedback capacitance.

Due to mismatches in the devices for the n-side and the p-side, the current into one of the two sides may need to be adjusted. The mismatch DAC 408a may be configured and controlled to provide a slight adjustment to the ramp current provided to the p-side ramp current to control for the mismatch between the p-side and n-side devices. While illustrated as connected to adjust the p-side current, the mismatch DAC 408a may also be connected and configured to provide adjustment for the n-side ramp current.

As discussed above, the output devices 402a and 402b may each be pre-charged while the other device is still on and acting as a low impedance device. The diode-connected device circuits 412a and 412b may be used in conjunction with the pre-charge current DACs 406a and 406b to generate a desired pre-charge voltage for each of the respective output devices 402a and 402b. The pre-charge voltage may be selected to bring a $V_{GS}$ of the respective output device 402a and 402b to a controlled value in the saturation region of the respective device, which may be value just above the turn-on voltage $V_{TH}$.

When the ramp current is adjusted to control the slope time of the output signal, the pre-charge $V_{GS}$ for the respective output device 402a and 402b may also need to be adjusted. This can be accomplished by selecting between one of several diode-connected devices of a respective diode-connected device circuit 412a or 412b and/or adjusting the pre-charge current from the respective pre-charge current DAC 406a or 406b. Similar to the ramp current, a mismatch DAC 408b may be used to trim the pre-charge current for the p-side to accommodate mismatches between devices of the n-side and the p-side. While illustrated as connected to adjust the p-side pre-charge current, in other examples the mismatch DAC 408b may be connected and configured to provide adjustment for the n-side pre-charge current.

When turning on the ramp current DACs 404a and 404b, glitches may appear on the output of the line driver 400, resulting in a decreased SFDR. In an example, to accommodate this, the ramp current DACs 404a and 404b can remain on and can either be sourced to the respective feedback capacitor 408a and 408b, or can contribute to the pre-charge voltage. In this example, the pre-charge DACs 406a and 406b can be resized such that the combination of the current from a respective ramp DAC 404a and 404b and the respective pre-charge DAC 406*a* and 406*b* provides the desired pre-charge voltage to the respective output device 402*a* and 402*b*.

Figure 5:
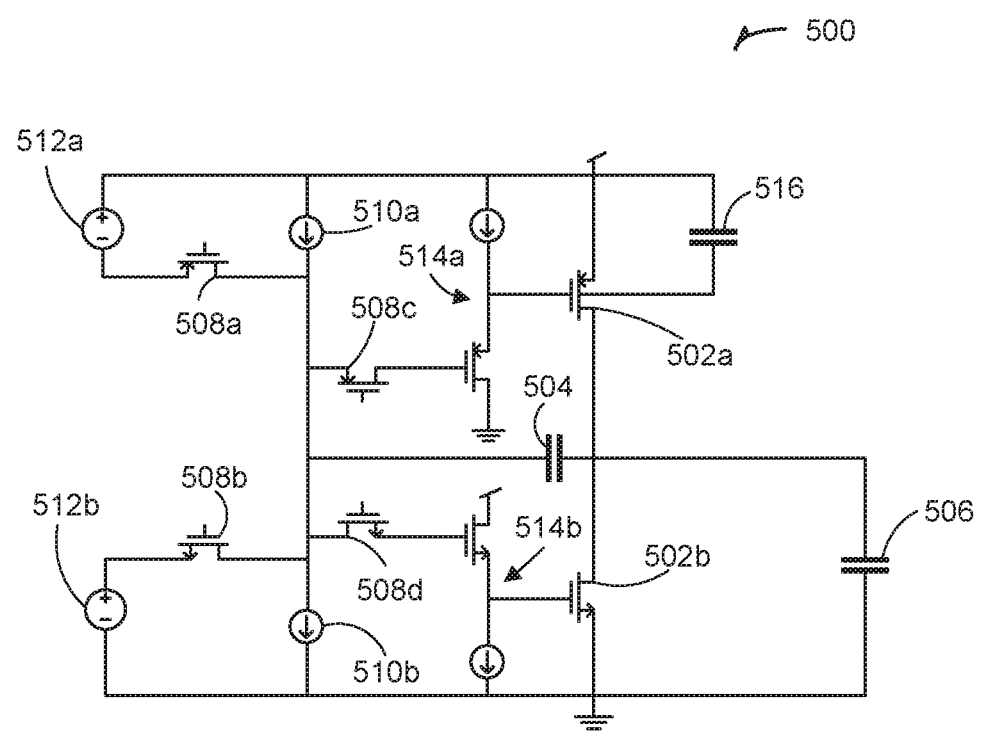
FIG. 5 is a figure that illustrates another example line driver circuit that generates a high SFDR output signal.

FIG. 5 is a figure that illustrates another example line driver circuit 500 that generates a high SFDR output signal. The line driver circuit 500 includes output devices 502*a* and 502*b*, feedback capacitor 504, output capacitor 506, transistors 508*a*-508*d*, current sources 510*a*-510*d*, pre-charge voltages 512*a* and 512*b*, source followers 514*a* and 514*b*, and parasitic capacitance 516. The feedback capacitor 504 is common between the p-side of the line driver circuit 500 and the n-side of the line driver circuit 500. By making the feedback capacitor 504 common between both sides of the line driver circuit 500, mismatch between the feedback capacitors is eliminated.

The source followers 514*a* and 514*b* may act as voltage buffers (acting as the voltage buffers 112*a* and 112*b* illustrated in FIG. 1, for example). The source follower 514*a* includes a transistor and a current source configured to decouple the parasitic capacitance 516 of the output device 502*a*. Similarly, the source follower 514*b* is configured to decouple the parasitic capacitance of the output device 502*b*. The current from the current source 510*a* is used as the ramp current for the output device 502*b*, and the current source 510*b* is used as the ramp current for the output device 502*a*.

The voltage sources 512*a* and 512*b* are used to generate the pre-charge voltage for the respective output devices 502*a* and 502*b*. While illustrated as voltage sources, the voltage sources 512*a* and 512*b* may be replaced with any circuit capable of being controlled to generate a desired pre-charge voltage. For example, the voltage sources 512*a* and 512*b* may be replaced with diode-connected device circuits similar to the diode-connected device circuits 412*a* and 412*b*, resistor-divider circuits, or any other circuit controllable to adjust the pre-charge voltage.

In some examples, one of the voltage sources 512*a* or 512*b* may be fixed to a specified voltage, and the other voltage source 512*a* or 512*b* may be controllable to set the pre-charge voltage based on the specified voltage. For example, the voltage source 512*a* may be set to a specified voltage for pre-charge of the p-side output device 502*a*. Then, at the beginning of operation of the line driver 500, the voltage source 512*b* may be set to a voltage for pre-charge of the n-side output device 502*b* based on the output capacitance 506, for example. As described below with reference to FIG. 6, a pre-charge voltage for one output device can be automatically set based on a measured gate voltage of the other output device. The gate voltage of the output device 502*a* can be sampled using the capacitor 516 through a switch, for example.

Figure 6:
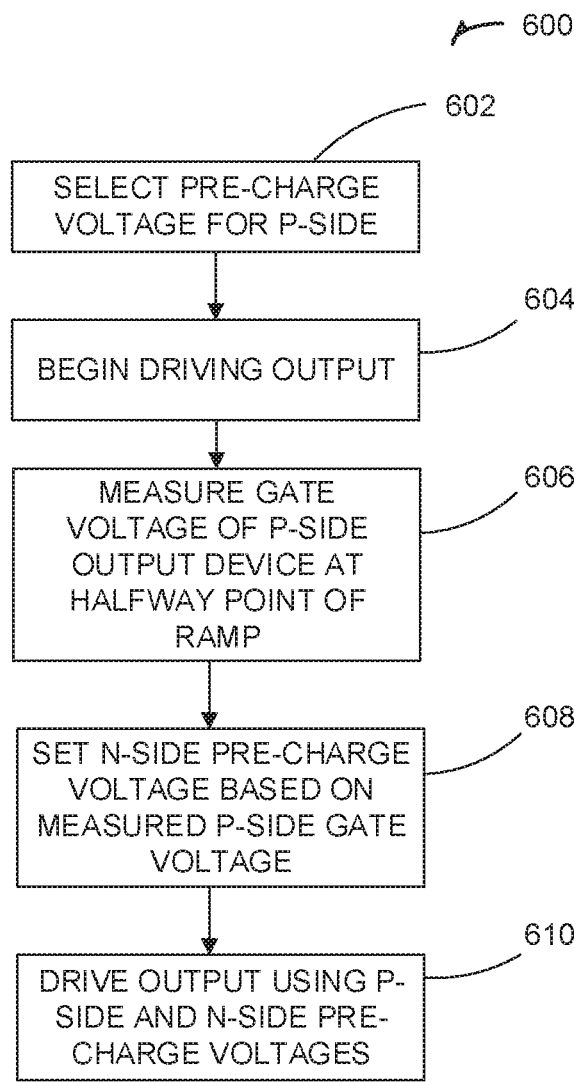
FIG. 6 is a flowchart illustrating a method of automatically setting a pre-charge voltage for a high SFDR line driver circuit.

FIG. 6 is a flowchart illustrating a method 600 of automatically setting a pre-charge voltage for a high SFDR line driver circuit. This method can be used to reduce second order sensitivities of the load capacitor, for example. At step 602, a pre-charge voltage is selected for the p-side of a line driver circuit, such as any of the line driver circuits discussed herein. At step 604, operation of the line driver circuit begins. At step 606, during the first rising transition of the output signal, the gate voltage of the p-side output device is measured at the halfway point of the transition. For example, for a 10V generated square wave, the gate voltage of the p-side output device may be sampled during the first rising edge when the output signal is 5V. This may be accomplished by sampling the gate voltage using the capacitor 516 illustrated in FIG. 5 through a switch, for example, when the output voltage is at 5V. At step 608, the pre-charge voltage for the n-side of the device is set based on the measured gate voltage of the p-side device at the halfway point of the transition. At step 610, the line driver operates using the determined n-side pre-charge voltage for the remaining falling transitions.

The gate voltage of the p-side device when the output is at the halfway point (e.g., 5V) is a good indicator of the load capacitance. The same method may be used to set the p-side pre-charge voltage. For example, the system may start with a specified n-side pre-charge voltage. At the first falling edge, the gate voltage of the n-side device may be measured at the halfway point of the falling edge (e.g., 5V of a 10V square wave output). The p-side pre-charge voltage may then be set using the measured n-side gate voltage for the halfway point. Pre-charge voltages may be set using current DACs, diode-connected devices, or a resistor divider circuit, for example. In one example, a lookup table may be indexed into using the halfway gate voltage to determine the pre-charge voltage for the respective other side of the line driver.

Figure 7:
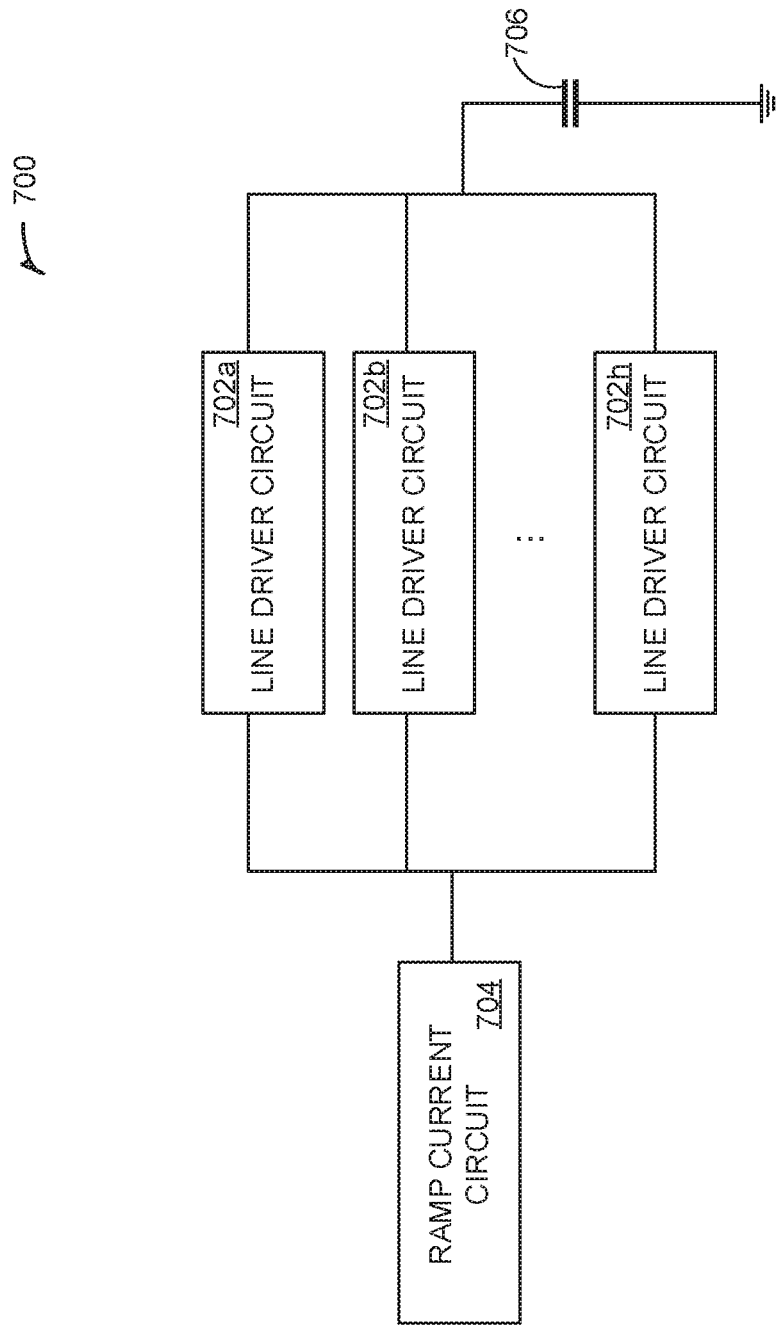
FIG. 7 illustrates a line driver that includes several parallel line driver circuits.

FIG. 7 illustrates a line driver 700 that includes several parallel line driver circuits 702*a*-702*h*. A single ramp current generation circuit 704 may be used to provide ramp current for each of the line driver circuits 702*a*-702*h*. The output of all the line driver circuits 702*a*-702*h* is provided to a common load 706. For large variations in load capacitance (for example, 1 nF to 15 nF), the number of devices needed to accommodate the desired slope times (for example, between 400 ns and 3.2 us) across all possible load capacitances may result in overly complex control for a single line driver circuit. Thus, knowing the load capacitance, a number of line driver circuits 702*a*-702*h* can be selected to operate in parallel to generate a high SFDR output for the respective load.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A line driver circuit configured to provide a high spurious free dynamic range output, the line driver comprising:
   a first output transistor controllable to pull an output node to a logic high state;
   a second output transistor controllable to pull the output node to a logic low state; and
   a first control circuit connected to a control input of the first output transistor, the first control circuit comprising:
   a first voltage buffer circuit;
   a feedback capacitor connected between the output node and the first voltage buffer circuit; and
   a first current source connectable to the feedback capacitor and the first voltage buffer circuit;
   wherein the first control circuit is controllable to establish a control signal at an output of the first voltage buffer circuit and the control input of the first output transistor at a first pre-charge value in a saturation operating region just above a turn-on threshold of the first output transistor while the second output transistor is in a low impedance operating state-to reduce an imbalance in turn-on delay between the first output transistor and the second output transistor.

2. The line driver circuit of claim 1, further comprising:
   a second control circuit connected to a control input of the second output transistor, the second control circuit comprising:
   a second voltage buffer circuit; and
   a second current source, the second control circuit configured to establish a control signal at an output of the second voltage buffer circuit the control input of the second output transistor while the first output transistor is in a low impedance operating state to further reduce the imbalance in the turn-on delay between the first output transistor and the second output transistor.

3. The line driver circuit of claim 2, wherein the second control circuit further comprises a second feedback capacitor connected between the output node and the second voltage buffer circuit, and wherein the first and the second voltage buffer circuits comprise source follower circuits.

4. The line driver circuit of claim 2, wherein the feedback capacitor is also connected between the output node and the second voltage buffer circuit.

5. The line driver circuit of claim 2, wherein the first current source comprises a first current digital-to-analog converter (DAC) controllable to provide a first current to the first control circuit selected to reduce the imbalance in turn-on delay between the first and the second output transistors, and the second current source comprises a second current DAC controllable to provide a second current to the second control circuit selected to reduce the imbalance in turn-on delay between the first and the second output transistors.

6. The line driver circuit of claim 5, wherein the first current source further comprises:
   a trim current DAC controllable to adjust the first current to the first control circuit, the first current adjusted to account for imbalances between components of the first and the second control circuits.

7. The line driver circuit of claim 2, wherein the first control circuit comprises a first voltage domain, the second control circuit comprises a second voltage domain, and the first and the second output transistors comprise a third voltage domain, and wherein the first voltage domain comprises:
   a first terminal that receives a first voltage from a first low-dropout regulator (LDO), and
   a second terminal that receives a second voltage from a second LDO, the second voltage less than the first voltage by a specified amount.

8. The line driver circuit of claim 7, wherein the second voltage domain comprises:
   a third terminal that receives the specified voltage from a third LDO, wherein the second control circuit is connected between the third terminal and ground, and wherein the third voltage domain is connected between the first LDO and ground.

9. The line driver circuit of claim 2, wherein the second control circuit is controlled to establish the control signal at the control input of the second output transistor at a second pre-charge value in a saturation operating region and just above a turn-on threshold of the second output transistor while the first output transistor is on and operating in the low impedance operating state, and wherein the second pre-charge value is determined during operation of the line driver based on an operational characteristic of the first output transistor.

10. A system comprising a plurality of the line driver circuits of claim 1, wherein each of the plurality of line driver circuits are connected to drive a common output, and wherein a control circuit is configured to connect a subset of the plurality of line driver circuits based on a load capacitance of the load connected to the common output.

11. A method of generating a high spurious free dynamic range output for a line driver, the method comprising:
   controlling first and second output transistors to pull an output node to a logic high state;
   generating, by a first control circuit, a control input for the first output transistor to establish a control signal at the control input at a first pre-charge value in a saturation operating region just above a turn-on threshold of the first output transistor while the second output transistor is on and operating in a low impedance state to reduce an imbalance in turn-on delay between the first output transistor and the second output transistor; and
   controlling the first and the second output transistor to pull the output node to a logic low state.

12. The method of claim 11, further comprising:
   generating, using a second control circuit, a control input for the second output transistor to establish a control signal at the control input of the second output transistor while the first output transistor is on and operating in a low impedance state to further reduce the imbalance in the turn-on delay between the first output transistor and the second output transistor.

13. The method of claim 12, further comprising:
providing, by a first current digital-to-analog converter (DAC), a first current to the first control circuit selected to reduce the imbalance in turn-on delay between the first and the second output transistors; and
providing, by a second current DAC, a second current to the second control circuit selected to reduce the imbalance in turn-on delay between the first and the second output transistors.

14. The method of claim 13, further comprising:
adjusting, by a trim current DAC, the first current to the first control circuit to account for imbalances between components of the first and the second control circuits.

15. The method of claim 12, wherein the first control circuit comprises a first voltage domain, the second control circuit comprises a second voltage domain, and the first and the second output transistors comprise a third voltage domain, and wherein the method further comprises:
receiving, by a first terminal of the first voltage domain, a first voltage from a first low-dropout regulator (LDO); and
receiving, by a second terminal of the first voltage domain, a second voltage from a second LDO, the second voltage less than the first voltage by a specified amount.

16. The method of claim 15, the method further comprising:
receiving, by a terminal of the second voltage domain, the specified voltage from a third LDO, wherein the second control circuit is connected between the terminal of the second voltage domain and ground, and wherein the third voltage domain is connected between the first LDO and ground.

17. The method of claim 12, wherein
generating, by the second control circuit, the control input for the second output transistor to establish the control signal at the control input while the first output transistor is on and operating in the low impedance state comprises establishing the control signal at the control input of the second output transistor at a second pre-charge value in a saturation operating region just above a turn-on threshold of the second output transistor while the first output transistor is on and operating in the low impedance state.

18. The method of claim 17, the method further comprising:
determining the second pre-charge value during operation of the line driver based on an operational characteristic of the first output transistor.

19. A line driver comprising:
first output means controllable to pull an output node to a logic high state;
second output means controllable to pull the output node to a logic low state; and
first control means connected to a control input of the first output means and configured to establish a control signal at the control input of the first output means at a first pre-charge value in a saturation operating region just above a turn-on threshold of the first output transistor while the second output means is in a low impedance operating state to reduce an imbalance in turn-on delay between the first output means and the second output means.

20. The line driver of claim 19, further comprising:
second control means connected to a control input of the second output means and configured to establish a control signal at the control input of the second output means while the first output means is in a low impedance operating state to further reduce the imbalance in the turn-on delay between the first output means and the second output means.

* * * * *